United States Patent
Hartl

(10) Patent No.: US 9,466,448 B2
(45) Date of Patent: Oct. 11, 2016

(54) HV RELAY STICKING CONTROL SYSTEM AND METHOD

(71) Applicant: FORD GLOBAL TECHNOLOGIES, LLC, Dearborn, MI (US)

(72) Inventor: Derek Hartl, Royal Oak, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 401 days.

(21) Appl. No.: 14/223,599

(22) Filed: Mar. 24, 2014

(65) Prior Publication Data

US 2015/0270081 A1 Sep. 24, 2015

(51) Int. Cl.
*H01H 47/00* (2006.01)
*B60R 16/03* (2006.01)
*B60L 3/00* (2006.01)
*G01R 31/327* (2006.01)

(52) U.S. Cl.
CPC .......... *H01H 47/002* (2013.01); *B60L 3/0069* (2013.01); *B60R 16/03* (2013.01); *G01R 31/3278* (2013.01); *H01H 2047/003* (2013.01)

(58) Field of Classification Search
CPC ............ H01H 47/002; G01R 31/3278; B60L 3/0069; B60R 16/03
USPC ....................................................... 361/170
See application file for complete search history.

(56) References Cited

U.S. PATENT DOCUMENTS

| | | | |
|---|---|---|---|
| 6,828,798 B2 | 12/2004 | Morimoto | |
| 7,242,196 B2 | 7/2007 | Yudahira et al. | |
| 7,368,829 B2 | 5/2008 | Tezuka | |
| 7,964,985 B2 | 6/2011 | Ozaki et al. | |
| 8,085,515 B2 | 12/2011 | Yugou et al. | |
| 2007/0221627 A1* | 9/2007 | Yugou | H01H 47/002 218/136 |
| 2012/0105065 A1* | 5/2012 | Namou | G01R 31/3275 324/415 |
| 2013/0093427 A1 | 4/2013 | Bemrich et al. | |
| 2013/0300429 A1* | 11/2013 | Jefferies | B60L 3/0069 324/511 |
| 2014/0016238 A1* | 1/2014 | Tazaki | H01H 47/002 361/88 |
| 2015/0137819 A1* | 5/2015 | Giordano | G01R 31/3278 324/418 |

FOREIGN PATENT DOCUMENTS

JP 2000134707 A 5/2000

* cited by examiner

*Primary Examiner* — Dharti Patel
(74) *Attorney, Agent, or Firm* — David Kelley, Esq.; Tung & Associates

(57) ABSTRACT

A high voltage relay sticking control system for a vehicle having at least one contactor, a high voltage battery pack interfacing with the contactor and a weld diagnostic detection system interfacing with the high voltage battery pack and the contactor includes an increment counter adapted to interface with the contactor, the high voltage battery pack and the weld diagnostic detection system. The increment counter is adapted to transmit at least one set of coil power cycles through the contactor if a weld exists at the contactor. A high voltage relay sticking control method is also disclosed.

20 Claims, 2 Drawing Sheets

HV RELAY STICKING CONTROL SYSTEM AND METHOD

FIELD

Illustrative embodiments of the disclosure generally relate to electric vehicles. More particularly, illustrative embodiments of the disclosure generally relate to an HV (high voltage) relay sticking control system and method which reopens HV battery contactors by cycling coil power through the contactors.

BACKGROUND

Electric vehicles including hybrid electric vehicles (HEVs) may include a high voltage battery pack which may be electrically connected to a pair of contactors. A high voltage bus may electrically interface with the contactors, and the vehicle electrical system may electrically interface with the high voltage bus. When the vehicle is turned off, the contactors are opened and the battery is electrically uncoupled from the high voltage bus. When the vehicle is turned on, the contactors are closed and the battery is electrically coupled to the high voltage bus.

Under some circumstances, a contact weld may occur at one or both of the contactors, causing the contactor to "stick" or remain closed. This may result in undesired flow of electrical current in the battery circuit or vehicle electrical system.

Accordingly, an HV (high voltage) relay sticking control system and method which reopens HV battery contactors by cycling coil power through the contactors is needed.

SUMMARY

Illustrative embodiments of the disclosure are generally directed to a high voltage relay sticking control system for a vehicle having at least one contactor, a high voltage battery pack interfacing with the contactor and a weld diagnostic detection system interfacing with the high voltage battery pack and the contactor. An illustrative embodiment of the high voltage relay sticking control system includes an increment counter adapted to interface with the contactor, the high voltage battery pack and the weld diagnostic detection system. The increment counter is adapted to transmit at least one set of coil power cycles through the contactor if a weld exists at the contactor.

Illustrative embodiments of the disclosure are further generally directed to a high voltage relay sticking control method for a vehicle having at least one contactor. An illustrative embodiment of the method includes detecting a weld at the at least one contactor and transmitting at least one set of coil power cycles through the at least one contactor.

BRIEF DESCRIPTION OF THE DRAWINGS

Illustrative embodiments of the disclosure will now be described, by way of example, with reference to the accompanying drawings, in which.

DETAILED DESCRIPTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable users skilled in the art to practice the disclosure and are not intended to limit the scope of the claims. Moreover, the illustrative embodiments described herein are not exhaustive and embodiments or implementations other than those which are described herein and which fall within the scope of the appended claims are possible. Furthermore, there is no intention to be bound by any expressed or implied theory presented in the preceding technical field, background, brief summary or the following detailed description.

Figure 1:
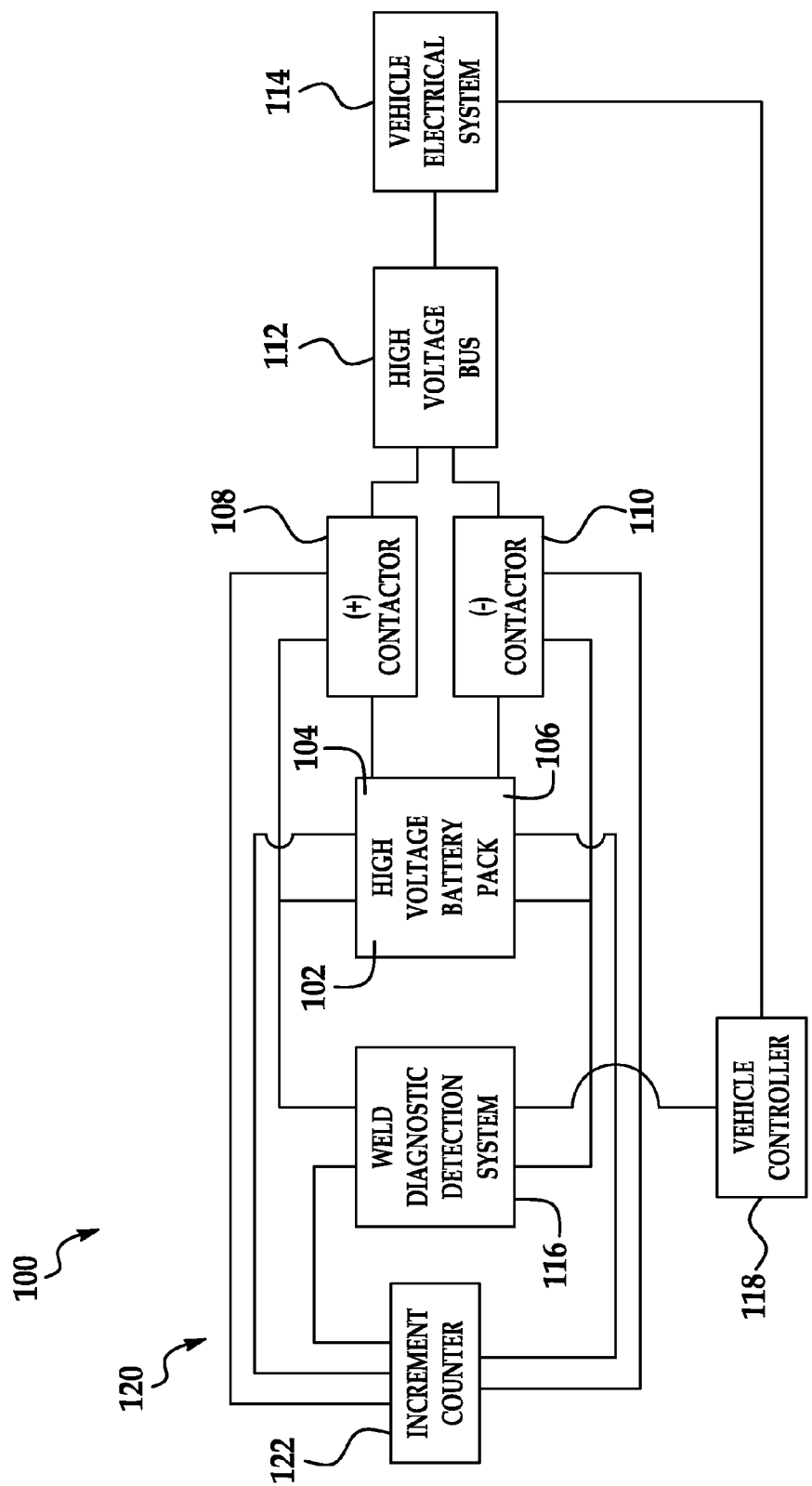
FIG. 1 is a block diagram of an illustrative embodiment of an HV relay sticking control system.
Figure 3:
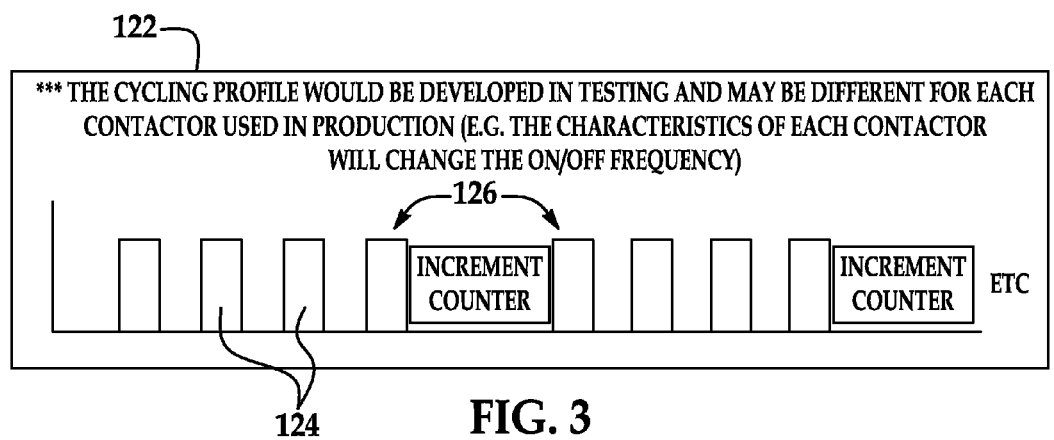
FIG. 3 is a block diagram of an exemplary increment counter which is suitable for implementation of the HV relay sticking control system and method.

Referring initially to FIGS. 1 and 3, an illustrative embodiment of a high voltage (HV) relay sticking control system is generally indicated by reference numeral 120 in FIG. 1. An exemplary electric vehicle which is suitable for implementation of the HV relay sticking control system 120 is generally indicated by reference numeral 100 in FIG. 1. In some embodiments, the electric vehicle 100 may be a hybrid vehicle (HEV) such as a plug in hybrid electric vehicle (PHEV), for example and without limitation. A block diagram of an exemplary increment counter 122 which is suitable for implementation of the HV relay sticking control system 100 is shown in FIG. 3.

The electric vehicle 100 may include a high voltage battery pack 102 which supplies electrical power to a vehicle electrical system 114. A positive contactor 108 and a negative contactor 110 may be electrically connected to a positive terminal 104 and a negative terminal 106, respectively, of the high voltage battery pack 102. A high voltage bus 112 may be electrically connected to the positive contactor 108 and the negative contactor 110. The vehicle electrical system 114 may be electrically connected to the high voltage bus 112.

When the ignition of the electric vehicle 100 is turned off, the positive contactor 108 and the negative contactor 110 are open to prevent flow of electrical current from the high voltage battery pack 102 to the vehicle electrical system 114 through the high voltage bus 112. When the ignition of the electric vehicle 100 is activated, the positive contactor 108 and the negative contactor 108 close. Accordingly, electrical current flows from the high voltage battery pack 102 to the vehicle electrical system 114 through the positive contactor 108, the negative contactor 110 and the high voltage bus 112, respectively, for operation of the electric vehicle 100.

A weld diagnostic detection system 116 may be electrically connected to the high voltage battery pack 102, the positive contactor 108 and the negative contactor 110. In the event that the weld diagnostic detection system 116 determines that a "weld" exists at the positive contactor 108 or the negative contactor 110, meaning that the positive contactor 108 or negative contactor 110 is stuck or has failed to open upon previous deactivation of the vehicle ignition, the weld diagnostic detection system 116 detects which of the positive contactor 108 and the negative contactor 110 is stuck, such as in the conventional manner. A vehicle controller 118 may interface with the weld diagnostic detection system 116 and the vehicle electrical system 114.

The HV relay sticking control system 120 may include an increment counter 122. The increment counter 122 may electrically interface with the high voltage battery pack 102, the positive contactor 108, the negative contactor 110 and the weld diagnostic detection system 116. In the event that it detects a weld at the positive contactor 108 or the negative contactor 110, the weld diagnostic detection system 116 notifies the increment counter 122. In response, the increment counter 122 may be adapted to initiate and sustain at least one set 126 (FIG. 3) of multiple coil power cycles 124 in which electrical current is transmitted in cycles from the high voltage battery pack 102 through the stuck positive contactor 108 or negative contactor 110. Therefore, the coil power cycles 124 may reopen the stuck positive contactor 108 or negative contactor 110.

The increment counter 122 may be adapted to notify the weld diagnostic detection system 116 after each set 126 of coil power cycles 124 is transmitted through the stuck positive contactor 108 or negative contactor 110. In response, the weld diagnostic detection system 116 may be adapted to recheck the stuck or open status of the positive contactor 108 or negative contactor 110 after each set 126 of coil power cycles 124. In the event that the weld diagnostic detection system 116 determines that the positive contactor 108 or negative contactor 110 is no longer stuck, the vehicle controller 118 may initiate ignition of the electric vehicle 100 such as via the vehicle electrical system 114. On the other hand, in the event that it determines that the positive contactor 108 or negative contactor 110 remains stuck, the weld diagnostic detection system 116 may again notify the increment counter 122. In response, the increment counter 122 may initiate and sustain a subsequent set 126 of the coil power cycles 124 through the stuck positive contactor 108 or negative contactor 110.

The increment counter 122 may be adapted to count the number of sets 126 of coil power cycles 124 which are transmitted through the stuck positive contactor 108 or negative contactor 110 as responses to notifications from the weld diagnostic detection system 116 that the positive contactor 108 or negative contactor 110 remains stuck. Therefore, in the event that the weld diagnostic detection system 116 notifies the increment counter 122 that the positive contactor 108 or negative contactor 110 remains stuck after a predetermined number of sets 126 of the power cycles 124 (such as 3 sets, for example and without limitation) has been transmitted through the stuck positive contactor 108 or negative contactor 110, the increment counter 122 may be adapted to terminate further transmission of coil power cycles 124 through the positive contactor 108 or negative contactor 110.

Figure 2:
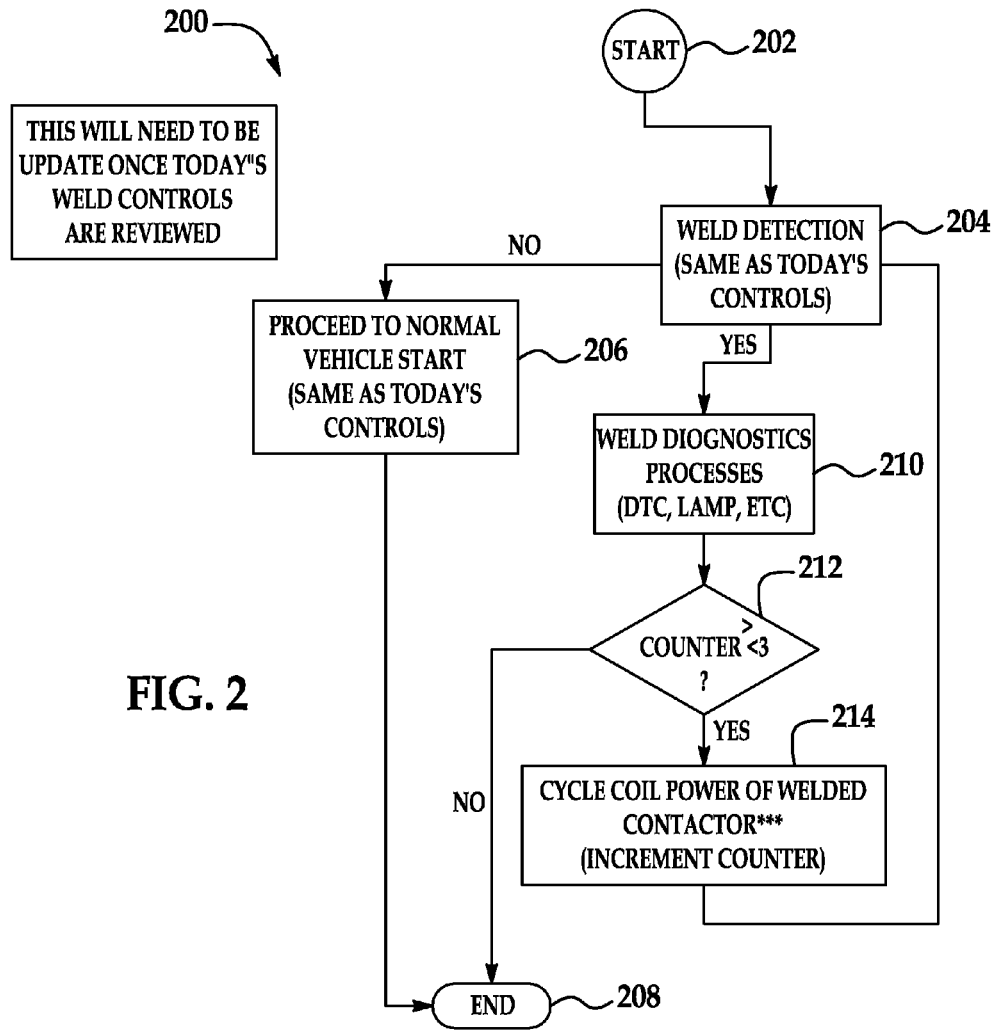
FIG. 2 is a block diagram of an illustrative embodiment of an HV relay sticking control method.

Referring next to FIG. 2, a block diagram of an illustrative embodiment of an HV relay sticking control method 200 for a vehicle is shown. The method 200 may start at block 202. At block 204, weld detection at a positive contactor or a negative contactor may be carried out. At block 206, the vehicle may proceed to start if a weld is not detected at one of the contacts at block 204 and the method 200 may then end at block 208.

In the event that a weld is detected at block 204, weld diagnostics processes may be carried out at block 210. At block 212, the number of sets of coil power cycles which have been transmitted through the stuck positive contactor or negative contactor may be counted. In the event that the number of transmitted sets of coil power cycles is equal to or less than a predetermined number such as 0-3, for example and without limitation), a first or subsequent set of coil power cycles may be transmitted through the stuck positive contactor or negative contactor in an attempt to open the contactor at block 214. Weld detection may then again be carried out at block 204. On the other hand, in the event that the number of transmitted sets of coil power cycles is greater than the predetermined number, further transmission of coil power cycles may be terminated and the method may end at block 208.

Although the embodiments of this disclosure have been described with respect to certain exemplary embodiments, it is to be understood that the specific embodiments are for purposes of illustration and not limitation, as other variations will occur to those of skill in the art.

What is claimed is:

1. A high voltage relay sticking control system for a vehicle having at least one contactor, a high voltage battery pack interfacing with the at least one contactor and a weld diagnostic detection system interfacing with the high voltage battery pack and the at least one contactor, comprising:
   an increment counter adapted to interface with the at least one contactor, the high voltage battery pack and the weld diagnostic detection system; and
   the increment counter is adapted to transmit at least one set of coil power cycles through the at least one contactor if a weld exists at the at least one contactor.

2. The high voltage relay sticking control system of claim 1 wherein the increment counter is adapted to receive notification from the weld diagnostic detection system when the weld diagnostic detection system detects the weld at the at least one contactor.

3. The high voltage relay sticking control system of claim 1 wherein the increment counter is adapted to notify the weld diagnostic detection system when the increment counter transmits the at least one set of coil power cycles through the at least one contactor.

4. The high voltage relay sticking control system of claim 1 wherein the increment counter is adapted to count the at least one set of coil power cycles.

5. The high voltage relay sticking control system of claim 4 wherein the increment counter is adapted to terminate further transmission of coil power cycles if the at least one set of coil power cycles exceeds a predetermined number of sets of coil power cycles.

6. The high voltage relay sticking control system of claim 5 wherein the increment counter is adapted to terminate further transmission of coil power cycles if the at least one set of coil power cycles exceeds three sets of coil power cycles.

7. The high voltage relay sticking control system of claim 1 wherein the increment counter is adapted to interface with a pair of contactors and transmit at least one set of coil power cycles through at least one of the pair of contactors if a weld exists at the at least one of the pair of contactors.

8. The high voltage relay sticking control system of claim 7 wherein the increment counter is adapted to count the at least one set of coil power cycles and terminate further transmission of coil power cycles if the at least one set of coil power cycles exceeds a predetermined number of sets of coil power cycles.

9. A high voltage relay sticking control method for a vehicle having at least one contactor, comprising:
   detecting a weld at the at least one contactor; and
   transmitting at least one set of coil power cycles through the at least one contactor.

10. The high voltage relay sticking control method of claim 9 further comprising rechecking the at least one contactor after transmitting at least one set of coil power cycles through the at least one contactor.

11. The high voltage relay sticking control method of claim 10 further comprising transmitting at least one set of coil power cycles through the at least one contactor after rechecking the at least one contactor.

12. The high voltage relay sticking control method of claim 11 further comprising counting the at least one set of coil power cycles.

13. The high voltage relay sticking control method of claim 12 further comprising terminating further transmission of coil power cycles through the at least one contactor after rechecking the at least one contactor for a predetermined number of times.

14. The high voltage relay sticking control method of claim 13 wherein rechecking the at least one contactor for a predetermined number of times comprises rechecking the at least one contactor three times.

15. A high voltage relay sticking control method for a vehicle having at least one contactor, comprising:
    checking at least one contactor for the presence of a weld;
    starting the vehicle if the weld is not detected at the at least one contactor; and
    transmitting at least one set of coil power cycles through the at least one contactor if the weld is detected at the at least one contactor.

16. The high voltage relay sticking control method of claim 15 further comprising rechecking the at least one contactor after transmitting at least one set of coil power cycles through the at least one contactor.

17. The high voltage relay sticking control method of claim 16 further comprising transmitting at least one set of coil power cycles through the at least one contactor after rechecking the at least one contactor.

18. The high voltage relay sticking control method of claim 17 further comprising counting the at least one set of coil power cycles.

19. The high voltage relay sticking control method of claim 18 further comprising terminating further transmission of coil power cycles through the at least one contactor after rechecking the at least one contactor for a predetermined number of times.

20. The high voltage relay sticking control method of claim 19 wherein rechecking the at least one contactor for a predetermined number of times comprises rechecking the at least one contactor three times.

\* \* \* \* \*